United States Patent [19]

Braun

[11] Patent Number: 4,859,957
[45] Date of Patent: Aug. 22, 1989

[54] METHOD FOR DEMODULATING AN FM SIGNAL

[75] Inventor: Walter Braun, Wettingen, Switzerland

[73] Assignee: BBC Brown Boveri AG, Baden, Switzerland

[21] Appl. No.: 254,697

[22] Filed: Oct. 7, 1988

[30] Foreign Application Priority Data

Oct. 8, 1987 [CH] Switzerland .................. 3940/87

[51] Int. Cl.$^4$ .............................................. H03D 3/00
[52] U.S. Cl. ...................................... 329/50; 455/214
[58] Field of Search ................. 329/50, 110, 122, 124; 455/212, 214, 296, 337

[56] References Cited

U.S. PATENT DOCUMENTS

| 4,567,442 | 1/1986 | Haussmann ......................... 329/145 |
| 4,583,239 | 4/1986 | Vance ................................ 329/107 |

OTHER PUBLICATIONS

Marshall, "A Radio-Paging Receiver Architecture and Demodulator", *Philips Journal of Reserach*, vol. 41, Supp. No. 2, 1986, Introduction pp. 1-6; Appendix A, pp. 113-118.

*Primary Examiner*—Eugene R. LaRoche
*Assistant Examiner*—Robert J. Pascal
*Attorney, Agent, or Firm*—Oblon, Spivak, McClelland, Maier & Neustadt

[57] ABSTRACT

A method for demodulating an FM signal (FM=Frequency Modulation), in which the FM signal is directly mixed down into an in-phase and a quadrature component of a complex frequency baseband and a modulation signal is determined from a phase relationship of the complex frequency baseband signal, and the phase relationship is determined from a curve length of the frequency baseband signal. The curve length is approximated by a length of a polygon curve which is spanned by successive sampled values of the complex frequency baseband signal. An estimated radius of an envelope curve of the complex frequency baseband is preferably used for normalizing the curve length. A signal receiver according to the invention comprises a direct converter (2), AC-coupled amplifiers (5a, 5b), a demodulator (6a) and a loudspeaker (8).

10 Claims, 4 Drawing Sheets

METHOD FOR DEMODULATING AN FM SIGNAL

BACKGROUND OF THE INVENTION

1. FIELD OF THE INVENTION

The invention relates to a method for demodulating an FM signal (FM=Frequency Modulation), in which the FM signal is directly mixed down into an in-phase and a quadrature component of a complex frequency baseband signal and a modulation signal is determined from a phase relationship of the complex frequency baseband signal.

2. DISCUSSION OF BACKGROUND

As mobile radio units become increasingly more widely distributed, so does the demand for added features. Such units should not only have good reception characteristics but should also be small, of light weight and compact. It is therefore important that the technology of highly integrated circuits can be advantageously utilized for the demodulation of FM signals. It has now been found that signal receivers operating in accordance with the principle of direct conversion are the most suitable for this so-called integration. That is to say, an FM signal is mixed down from a carrier frequency into the frequency baseband without using any intermediate frequency stages.

However, a frequency baseband signal obtained in this manner must still be amplified in most cases for further processing. To avoid offset problems, AC-coupled amplifiers are usually used.

In the printed document "A radio-paging receiver architecture and Demodulator" by C. B. Marshall, Philips Journal of Research, Vol. 41, Supplement No. 2, 1986, a signal receiver for the demodulation of digital data is disclosed which operates in accordance with the principle of direct conversion. If it is intended to use such a signal receiver for the demodulation of FM signals, signal distortions occur which mainly originate from the AC-coupled amplifier. In contrast to digital signals, analog signals have direct-current components which cannot be neglected. Due to the fact that these are suppressed by an AC-coupled amplifier, considerable signal distortions arise, for example after pauses in speaking.

SUMMARY OF THE INVENTION

The invention has the object of specifying a method for demodulating an FM signal, the FM signal being directly mixed down into an in-phase and a quadrature component of a complex frequency baseband signal and a modulation signal being determined from a phase relationship of the complex frequency baseband signal, which method compensates for a distortion of the frequency baseband signal due to an attenuation of its direct-current component.

According to the invention, the method by which the object is achieved consists in the fact that the phase relationship is determined from a curve length of the frequency baseband signal.

In a preferred embodiment of the invention, an estimated radius of an envelope curve of the complex frequency baseband signal is additionally determined which is utilized for a normalization of the curve length. In this manner, a regulation of a power level of the modulation signal can be integrated in a demodulator.

Further preferred embodiments of the invention are obtained from the subclaims.

BRIEF DESCRIPTION OF THE DRAWINGS

In the text which follows, the invention will be explained in greater detail with reference to illustrative embodiments, in conjunction with the drawing in which.

DESCRIPTION OF THE PREFERRED EMBODIMENTS

In a first illustrative embodiment, a signal receiver is described in which a regulation of a power level of a modulation signal is integrated in a demodulator.

Figure 1A:
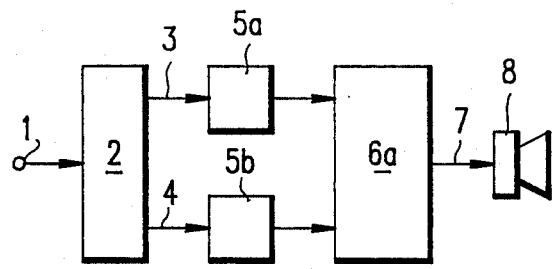
FIG. 1A shows the block diagram of a signal receiver.

FIG. 1A shows a block diagram of a signal receiver which operates in accordance with the method according to the invention. An FM signal 1 of, for example, a few 100 MHz is supplied to a direct converter 2. This mixes the FM signal 1 directly down into a frequency baseband. A complex frequency baseband signal is produced which is output by the direct converter 2 in the form of an in-phase component 3 and of a quadrature component 4. In-phase and quadrature components 3, 4 are amplified by AC-coupled amplifiers 5a, 5b and forwarded to a demodulator 6a. The demodulator 6a generates an analog modulation signal 7 which is rendered audible in a loudspeaker 8.

Figure 1B:
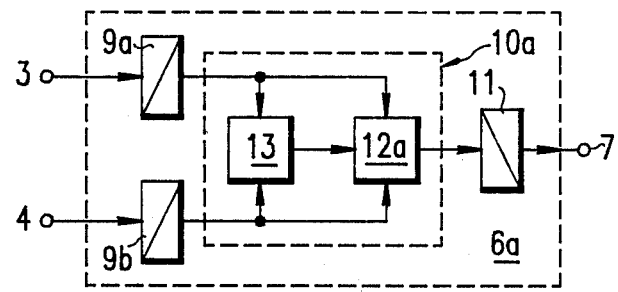
FIG. 1B shows the block diagram of a demodulator with an integrated regulation of a power level.

FIG. 1B shows a block diagram of the demodulator 6a. In-phase and quadrature components 3, 4 of the complex frequency baseband signal are sampled with a given sampling frequency in A/D converters 9a, 9b and digitized. In a computing circuit 10a, a phase-estimating algorithm 12a and an amplitude-estimating algorithm 13 are implemented. The phase-estimating algorithm 12a determines a phase relationship of the complex frequency baseband signal and supplies at an output a digitized form of the modulation signals 7 which is converted into the analog modulation signal 7 by means of a D/A converter 11.

The core of the invention lies in the method for obtaining the digitized form of the modulation signal 7 from a digital form of the in-phase and quadrature component of the complex frequency baseband signal. The principle of this method will be explained with reference to a graphic representation.

Figure 2:
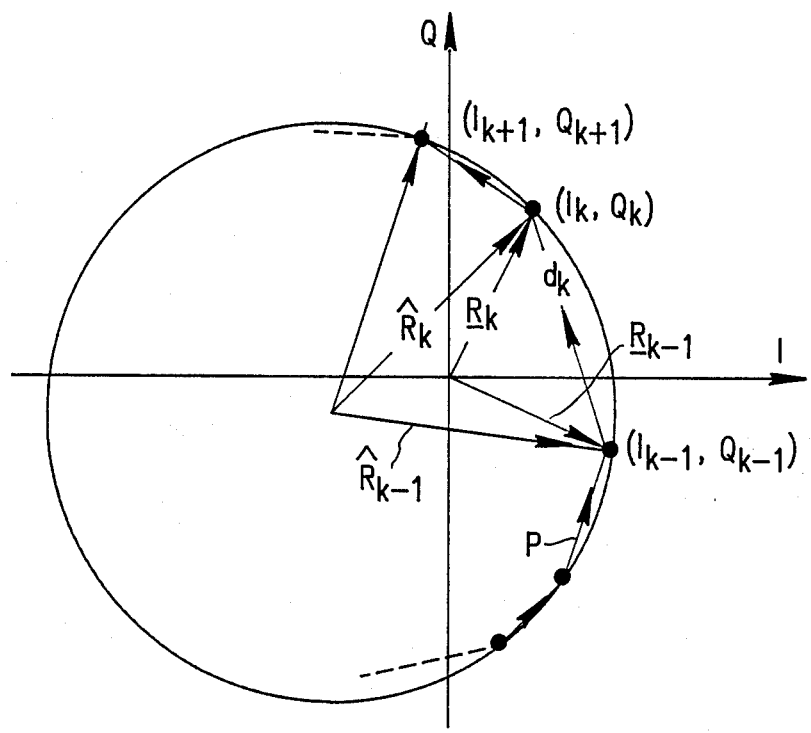
FIG. 2 shows the representation of a complex frequency baseband signal.

FIG. 2 shows a graphic representation of the complex frequency baseband signal which is present at the demodulator 6a. The in-phase component 3 is plotted along the abscissa and the quadrature component 4 along the ordinate. A complex frequency baseband signal is thus represented as a curve in a plane. Each point of the curve can be assigned a phase vector which begins at the origin of this representation and ends at the point concerned. In an ideal case, the frequency baseband signal has a circle with a centerpoint at the origin and a constant radius as envelope curve. In this case, the phase relationship is obtained from the direction of the phase vector, that is to say in known manner as arctan (I/Q) with I=in-phase component and Q=quadrature component. If then the frequency baseband signal is amplified, for example by means of an AC-coupled amplifier, the centerpoint of the envelope curve begins to travel around since direct-current components of the frequency baseband signal have been attenuated. The type of movement of the centerpoint is essentially determined by a cut-off frequency of the amplifier 5a, 5b. This cut-off frequency is typically about 10 Hz. In comparison, the frequencies of a voice signal which are usually between 300 and 3,000 Hz, are high so that the centerpoint of the envelope curve moves comparatively slowly if it happens to have travelled away from the origin, for example due to a pause in speaking. Thus, a determination of the phase relationship of the frequency baseband signal on the basis of the direction of the phase vector leads to considerable distortions.

The principle of the invention then lies in determining the phase relationship not on the basis of the direction of the phase vector but on the basis of the curve length of the frequency baseband signal.

Due to the sampling, a polygon curve P is obtained which is spanned by successive sampled values of the complex frequency baseband signal. The polygon curve P is used as an approximation of the complex frequency baseband signal. An increase $d_k$ in the curve length of the frequency baseband signal is thus obtained from the amount and sign, as follows:

An amount of the increase $d_k$ is determined by a euclidic distance between a new sampled value $(I_k, Q_k)$ and an adjacent preceding sampled value $(I_{k-1}, Q_{k-1})$, that is to say:

$$d_k = \sqrt{(I_k - I_{k-1})^2 + (Q_k - Q_{k-1})^2} \quad \text{(I)}$$

and a sign of the increase $d_k$ is given by a sign of a vector product (represented by the character "x") of associated phase vectors $\underline{R}_k$ and $\underline{R}_{k-1}$, that is to say:

$$\text{sign}(d_k) = \text{sign}(R_{k-1} \times R_k) \quad \text{(II)}$$

$$\text{sign}(x) = \begin{cases} 1 & \text{for } x > 0 \\ 0 & \text{for } x = 0 \\ -1 & \text{for } x < 0 \end{cases} \quad \text{(III)}$$

At the same time as it demodulates the complex frequency baseband signal, the computing circuit 10a regulates the power level of the modulation signal 7. For this purpose, the amplitude-estimating algorithm 13 determines an estimated radius $\hat{R}_k$ of the envelope curve of the complex frequency baseband signal. A digital value $s_k$ of the modulation signal 7 is obtained by a normalization of the increase $d_k$ by means of the estimated radius $\hat{R}_k$:

$$s_k = d_k / \hat{R}_k \quad \text{(IV)}$$

In addition, the increase $d_k$ is preferably set to zero if the estimated radius falls below a threshold value $R_{min}$ given by a noise level of the signal receiver. In this manner, the effect of a squelch circuit is integrated in the computing circuit 10a.

Another preferred possibility for limiting the noise consists in normalizing the increase $d_k$ by means of a given threshold value $R_{min}$ if the estimated radius $R_k$ falls below this threshold value $R_{min}$. This makes it possible to prevent, for example, an FM signal having a low power resulting in a loud noise in the loudspeaker.

The amplitude-estimating algorithm 13 can be implemented, for example, as follows. For each sampled value of the complex frequency baseband signal, a length $R_k$ of the associated phase vector $\underline{R}_k$ is determined:

$$R_k = |\underline{R}_k| = \sqrt{I_k^2 + Q_k^2} \quad \text{(V)}$$

$I_k$ = In-phase component
$Q_k$ = Quadrature component } at time $kT_o$

An estimated radius $\hat{R}_k$ is generated by smoothing these lengths $R_k$ of the phase vectors. The smoothing can be performed, for example, by means of a first-order low-pass filter having a suitable cut-off frequency. This corresponds to a particularly simple embodiment. Naturally, other methods for smoothing can also be used as long as the computing circuit 10a has a correspondingly large computing capacity.

The sampling frequency represents an essential parameter of the demodulator 6a and of the A/D converters 9a, 9b, respectively. If the frequency is selected to be too low, the approximation of the curve length of the frequency baseband signal according to the invention becomes poor due to the length of the polygon curve P. From this consideration, the sampling frequency should be at least 5-times as high as a frequency deviation of the frequency baseband signal. Since the frequency baseband signal in a transmission of audio signals has a bandwidth of typically 5 kHz, the sampling frequency should accordingly be at least about 25 kHz.

Figure 3:
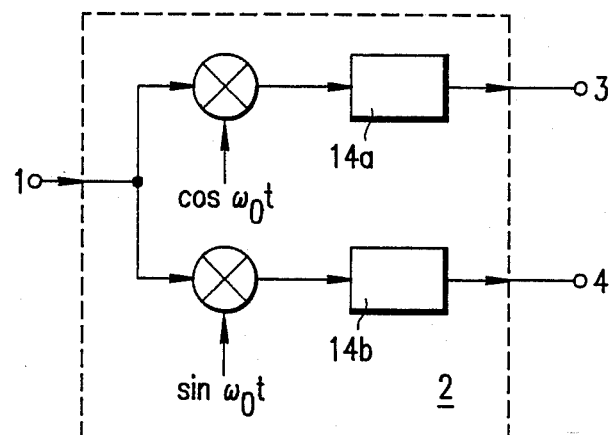
FIG. 3 shows the block diagram of a direct converter.

FIG. 3 shows a block diagram of a direct converter 2. The incoming FM signal 1 is divided into two signal paths. On one, the in-phase component 3 is generated by multiplication by $\cos\omega_o t$ ($\omega_o$ designating the carrier frequency) and filtering with a low-pass filter 14a and on the other the quadrature component 4 of the complex frequency baseband signal is generated by multiplication by $\sin\omega_o t$ and filtering by means of a low-pass filter 14b. The details of such a direct converter 2 are known and can be found, for example, in the initially mentioned printed document by C. B. Marshall.

In a second illustrative embodiment, a signal receiver will be described in which the power level of the modulation signal is regulated outside the demodulator.

Figure 4A:
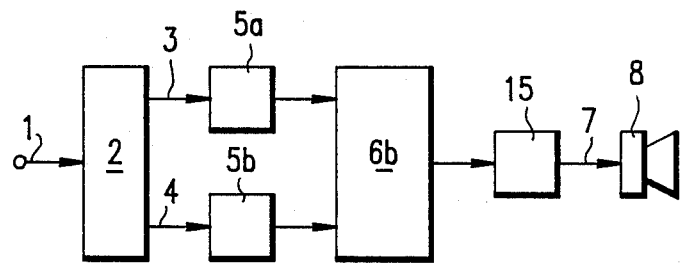
FIG. 4 shows the block diagram of a signal receiver with a separate regulation of a power level.
FIG. 4B shows the block diagram of a demodulator without regulation of the power level.
Figure 4B:
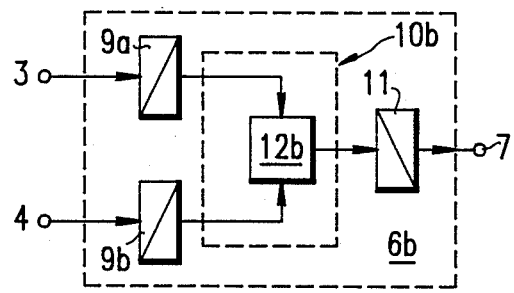

FIG. 4a shows a block diagram of such a signal receiver. It exhibits a similar configuration to the signal receiver shown in FIG. 1 (which is why identical parts are provided with identical reference symbols for better clarity). Parts already described will no longer be separately discussed at this point.

Compared with the first illustrative embodiment (FIG. 1a) a level regulator 15 has been newly added. It regulates the power level of the modulation signal 7 coming from the demodulator 6b. As a consequence, a simplified computing circuit 10b can be used. This now comprises a phase-estimating algorithm 12b which determines an increase $d_k$ in the manner described above. In contrast to the first illustrative embodiment, the increase $d_k$ in the curve length is not normalized. A digital value $s_k$ of the modulation signal 7 then directly corresponds to the increase $d_k$.

This second illustrative embodiment is thus characterized by a particularly simple computing circuit. Higher sampling frequencies for example, can thus be implemented, in this manner without problems.

To illustrate the advantageous effect of the invention, the result of a simulation of a method according to the invention will be compared with that of a known method in the text which follows.

The configuration of a signal receiver according to the invention can be selected, for example, as in the first illustrative embodiment (FIG. 1A, 1B). In this arrangement, the AC-coupled amplifiers 5a, 5b have a cut-off frequency of about 10 Hz. The sampling frequency of the A/D converters 9a, 9b is 28 kHz. The amplitude-estimating algorithm 13 performs a smoothing operation which exhibits a cut-off frequency of about 140 Hz. To clarify the result, the signal receiver has been assumed to be noise-free. The received FM signal 1 to be demodulated is assumed to be transmitting a unit step. That is to say, in an ideal receiver, the modulation signal would perform a jump from 0 to 1.

Figure 5A:
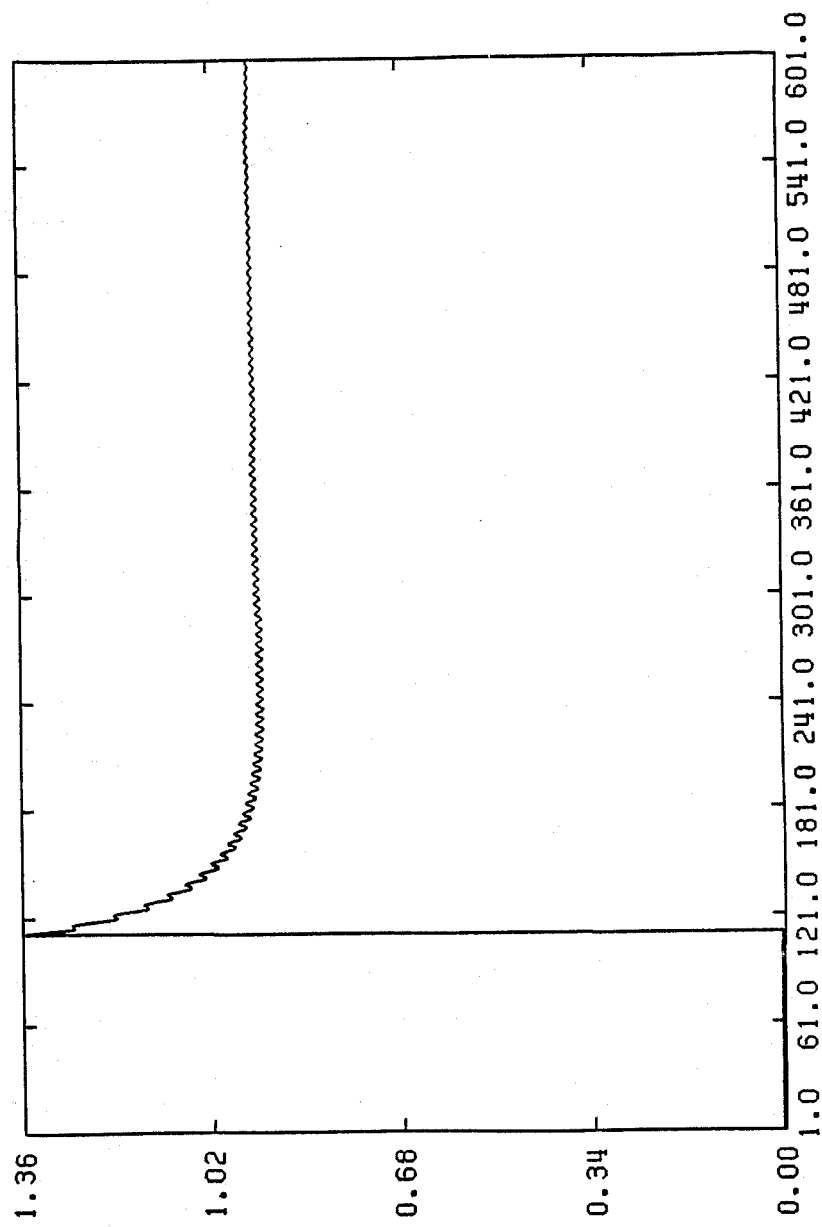
FIG. 5A shows a representation of a modulation signal generated in accordance with a method according to the invention.

FIG. 5A shows a representation of the modulation signal 7 which is produced due to an FM signal demodulated in accordance with the invention.

Figure 5B:
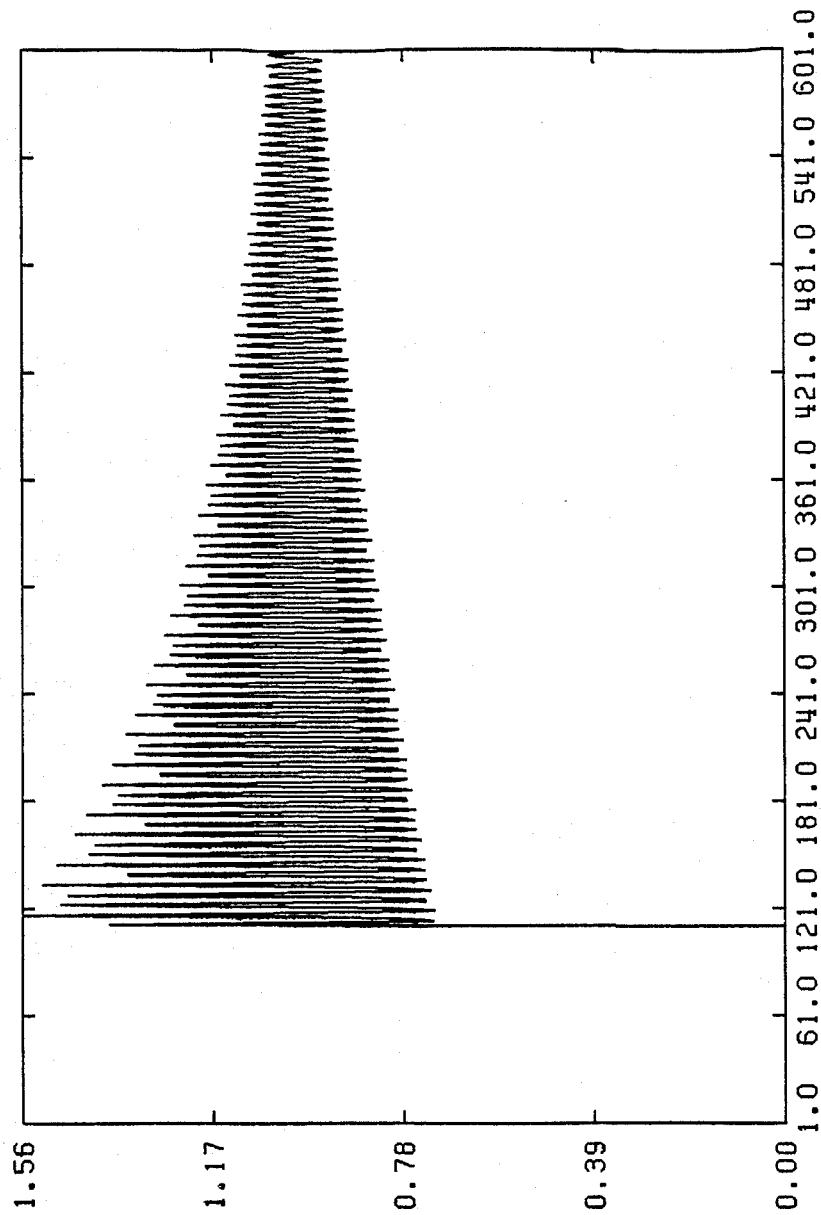
FIG. 5B shows a representation of a modulation signal generated in accordance with a known method.

FIG. 5B shows, as a comparison to this, a representation of a modulation signal generated by means of a demodulation method according to the prior art.

In each case, the time is plotted in units of 1 sampling interval T(T=1/28000 sec=35.7 msec) along the abscissa and a normalized amplitude of the modulation signal is plotted along the ordinate. The overshoot of the modulation signal visible in FIG. 5B and lasting for a long time, which becomes noticeable as an unpleasant noise in the loudspeaker, mainly after pauses in speaking, is largely avoided by the invention (compare FIG. 5A).

The features of the invention can be combined into advantageous embodiments in a variety of ways. All embodiments have the common feature that they are capable of compensating signal distortions due to attenuated direct-current components. The digital design of the demodulator, the application of which is in no way restricted to the demodulation of audio signals, renders a signal receiver according to the invention easily accessible to an integration of other functions.

What is claimed as new and desired to be secured by letters patent of the United States is:

1. A method for demodulating an FM signal (FM=Frequency Modulation), in which
   (a) the FM signal is directly mixed down into an in-phase and a quadrature component of a complex frequency baseband signal, and
   (b) a modulation signal is determined from a phase relationship of the complex frequency baseband signal, wherein
   (c) the phase relationship is determined from a curve length of the complex frequency baseband signal.

2. A method as claimed in claim 1, wherein in-phase and quadrature components of the complex frequency baseband signal are amplified by means of an AC-coupled amplifier.

3. A method as claimed in claim 2, wherein the curve length is approximated by a length of a polygon curve which is spanned by successive sampled values of the complex frequency baseband signal, a sampling frequency being used which is at least five-times as high as a frequency deviation of the frequency baseband signal.

4. A method as claimed in claim 3, wherein for each new sampled value of the complex frequency baseband signal, an increase in the curve length compared with an adjacent preceding sampled value is determined, an amount of the increase being given by a euclidic distance between new and adjacent preceding sampled values and a sign of the increase being given by a sign of a vector product of associated phase vectors.

5. A method as claimed in claim 4, wherein an estimated radius of an envelope curve of the complex frequency baseband signal is determined.

6. A method as claimed in claim 5, wherein the increase in the curve length is normalized by means of the estimated radius.

7. A method as claimed in claim 6, wherein the increase in the curve length is set to zero if the estimated radius falls below a given threshold value.

8. A method as claimed in claim 6, wherein the increase in the curve length is normalized by means of a given threshold value if the estimated radius falls below this threshold value.

9. A method as claimed in claim 5, wherein a power level of the modulation signal is regulated.

10. Method as claimed in claim 5, wherein the estimated radius is determined in such a manner that for each sampled value of the complex frequency baseband signal, a length of the associated phase vector is determined, and the estimated radius is obtained from a low-pass filtering of the lengths determined.

* * * * *